(12) United States Patent
Kakimoto et al.

(10) Patent No.: US 9,274,153 B2
(45) Date of Patent: Mar. 1, 2016

(54) ELECTROSTATIC CAPACITANCE SENSOR

(71) Applicant: PANASONIC CORPORATION, Osaka (JP)

(72) Inventors: Katsumi Kakimoto, Osaka (JP); Hitoshi Yoshida, Osaka (JP); Nobuyuki Ibara, Osaka (JP); Shinichi Kishimoto, Osaka (JP); Hideki Ueda, Osaka (JP); Takeshi Okada, Osaka (JP); Takeshi Mori, Osaka (JP); Masatoshi Nomura, Osaka (JP); Jun Ogihara, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 228 days.

(21) Appl. No.: 13/782,777

(22) Filed: Mar. 1, 2013

(65) Prior Publication Data

US 2013/0229193 A1 Sep. 5, 2013

(30) Foreign Application Priority Data

Mar. 2, 2012 (JP) ................................ 2012-046640

(51) Int. Cl.
*G01R 27/26* (2006.01)
*G01P 15/08* (2006.01)
*G01P 15/125* (2006.01)
*B81B 3/00* (2006.01)

(52) U.S. Cl.
CPC .......... *G01R 27/2605* (2013.01); *B81B 3/0086* (2013.01); *G01P 15/0802* (2013.01); *G01P 15/125* (2013.01); *B81B 2201/0235* (2013.01)

(58) Field of Classification Search
CPC ... G01P 15/125; G01P 15/0802; G01L 1/142; G01L 9/0072; B81B 2201/0235; G01R 27/2605; G01R 29/12
USPC ............. 324/519, 751.17, 548, 658, 686, 661
See application file for complete search history.

(56) References Cited

U.S. PATENT DOCUMENTS

| 4,574,327 | A | * | 3/1986 | Wilner ......................... 361/283.4 |
| 4,882,933 | A | * | 11/1989 | Petersen et al. ............. 73/514.13 |
| 4,999,735 | A | * | 3/1991 | Wilner ......................... 361/283.3 |
| 5,367,429 | A | * | 11/1994 | Tsuchitani et al. ........... 361/280 |

(Continued)

FOREIGN PATENT DOCUMENTS

| JP | 2006-133245 A | 5/2006 |
| JP | 2010-127648 | * 6/2010 .............. G01P 15/18 |

(Continued)

OTHER PUBLICATIONS

Extended European Search Report issued in corresponding European Application No. 13157351.1, dated Sep. 13, 2013.

*Primary Examiner* — Alesa Allgood
(74) *Attorney, Agent, or Firm* — McDermott Will & Emery LLP

(57) ABSTRACT

An electrostatic capacitance sensor 1 includes a semiconductor substrate 4. A first fixing plate 2 is joined to a one-side surface 4a of the semiconductor substrate 4, and a second fixing plate 3 is joined to other-side surface 4b of the semiconductor substrate 4, whereby a space portion S is formed. Then, static electricity suppressing means 70 for suppressing static electricity from being generated in the space portion S is provided in the electrostatic capacitance sensor 1.

9 Claims, 14 Drawing Sheets

(56) References Cited

U.S. PATENT DOCUMENTS 7,795,885 B2 * 9/2010 Gorczyca et al. ........ 324/754.23
8,384,398 B2 * 2/2013 Laflamme et al. ............ 324/663

FOREIGN PATENT DOCUMENTS

| JP | 2010-127648 A | 6/2010 |
| WO | 01-09622 A2 | 2/2001 |

* cited by examiner

FIG. 9

| | | DIRECTION OF ACCELERATION | | | |
|---|---|---|---|---|---|
| | | +X | −X | +Z | −Z |
| ELECTRO-STATIC CAPACITANCE | C1<br>C2<br>C3<br>C4 | C0+ΔC<br>C0−ΔC<br>C0+ΔC<br>C0−ΔC | C0−ΔC<br>C0+ΔC<br>C0−ΔC<br>C0+ΔC | C0−ΔC<br>C0+ΔC<br>C0+ΔC<br>C0−ΔC | C0+ΔC<br>C0−ΔC<br>C0−ΔC<br>C0+ΔC |
| DIFFERENCE | CA<br>(C1−C2) | +2ΔC | −2ΔC | −2ΔC | +2ΔC |
| | CB<br>(C3−C4) | +2ΔC | −2ΔC | +2ΔC | −2ΔC |
| X-OUTPUT | CA+CB | +4ΔC | −4ΔC | 0 | 0 |
| Z-OUTPUT | CA−CB | 0 | 0 | −4ΔC | +4ΔC |

ELECTROSTATIC CAPACITANCE SENSOR

CROSS REFERENCE TO RELATED APPLICATIONS

This application is based upon and claims the benefit of priority from prior Japanese Patent Application P2012-046640 filed on Mar. 2, 2012; the entire contents of which are incorporated by reference herein.

BACKGROUND OF THE INVENTION

The present invention relates to an electrostatic capacitance sensor.

Heretofore, as shown in Japanese Patent Laid-Open Publication No. 2010-127648 (hereinafter, referred to as Patent Literature 1), an electrostatic capacitance sensor has been known, in which an upper fixing plate and a lower fixing plate are joined respectively to front and back surfaces of a semiconductor substrate including a frame portion and movable bodies having movable electrodes.

In this Patent Literature 1, fixed electrodes arranged apart from the movable electrodes of the movable bodies so as to be opposite thereto are formed on the upper fixing plate. Moreover, central portions of the movable bodies are supported by beams, and gravitational center positions of both end sides of each of the movable bodies are made asymmetric to each other while taking, as a boundary, each of the central portions supported by the beams concerned, whereby the movable bodies swing in the event where an acceleration is inputted thereto.

Then, a difference of electrostatic capacitance to be changed between both end sides of each of the movable electrodes and the fixed electrodes in the event where the movable bodies swing is arithmetically operated, whereby a magnitude of the acceleration to be inputted is detected.

SUMMARY OF THE INVENTION

However, in the above-described conventional technology, each of the movable bodies is formed by using an SOI substrate in which an embedded insulating layer made of $SiO_2$ is interposed between a silicon active layer made of Si and a support substrate made of Si. Moreover, such a fixing plate on which the fixed electrodes are formed is formed by using glass. This glass is an insulator, and is electrically unstable. Therefore, it is apprehended that a potential difference may occur between the fixing plate and each of the movable bodies. When the potential difference occurs between the fixing plate and each movable body as described above, it is apprehended that an attitude of each movable body may vary by static electricity generated by the potential difference.

As described above, in the conventional technology, it has been apprehended that detection accuracy of the electrostatic capacitance sensor may be decreased.

In this connection, it is an object of the present invention to provide an electrostatic capacitance sensor capable of suppressing the detection accuracy from being decreased.

A first feature of the present invention is summarized to be an electrostatic capacitance sensor, including: a semiconductor substrate in which a movable body having a movable electrode is formed, a first fixing plate joined to one surface of the semiconductor substrate, a second fixing plate joined to the other surface of the semiconductor substrate, a fixed electrode formed on the first fixing plate and arranged opposite to the movable electrode at an interval, wherein the first fixing plate is joined to one surface of the semiconductor substrate, and the second fixing plate is joined to the other surface of the semiconductor substrate, whereby a space portion is formed, wherein static electricity suppressing means for suppressing static electricity from being generated in the space portion is provided in the electrostatic capacitance sensor.

A second feature of the present invention is summarized in that the static electricity suppressing means is a metal film formed on at least one of a spot of an inner surface of the first fixing plate, the spot being other than a spot on which the fixed electrode is formed, and of an inner surface of the second fixing plate, and the metal film is electrically insulated from the fixed electrode, and is electrically connected to the movable body.

A third feature of the present invention is summarized in that the movable body is formed without using an insulator.

A fourth feature of the present invention is summarized in that the metal film is formed on a recessed portion formed on either of the inner surface of the first fixing plate and the inner surface of the second fixing plate.

A fifth feature of the present invention is summarized in that the second fixing plate is a conductor.

A sixth feature of the present invention is summarized in that a recessed portion is formed on the inner surface of the second fixing plate.

A seventh feature of the present invention is summarized in that the static electricity suppressing means is a static electricity suppressing material filled in the space portion.

An eighth feature of the present invention is summarized in that static electricity suppressing material is either of ionized air and inert gas.

A ninth feature of the present invention is summarized in that a communication path that allows the space portion to communicate with an outer space is formed in the electrostatic capacitance sensor.

BRIEF DESCRIPTION OF THE DRAWINGS

FIG. 9 is an explanatory view showing output arithmetic expressions of the electrostatic capacitance sensor in a table format.

DETAILED DESCRIPTION OF THE PREFERRED EMBODIMENTS

Figure 1:
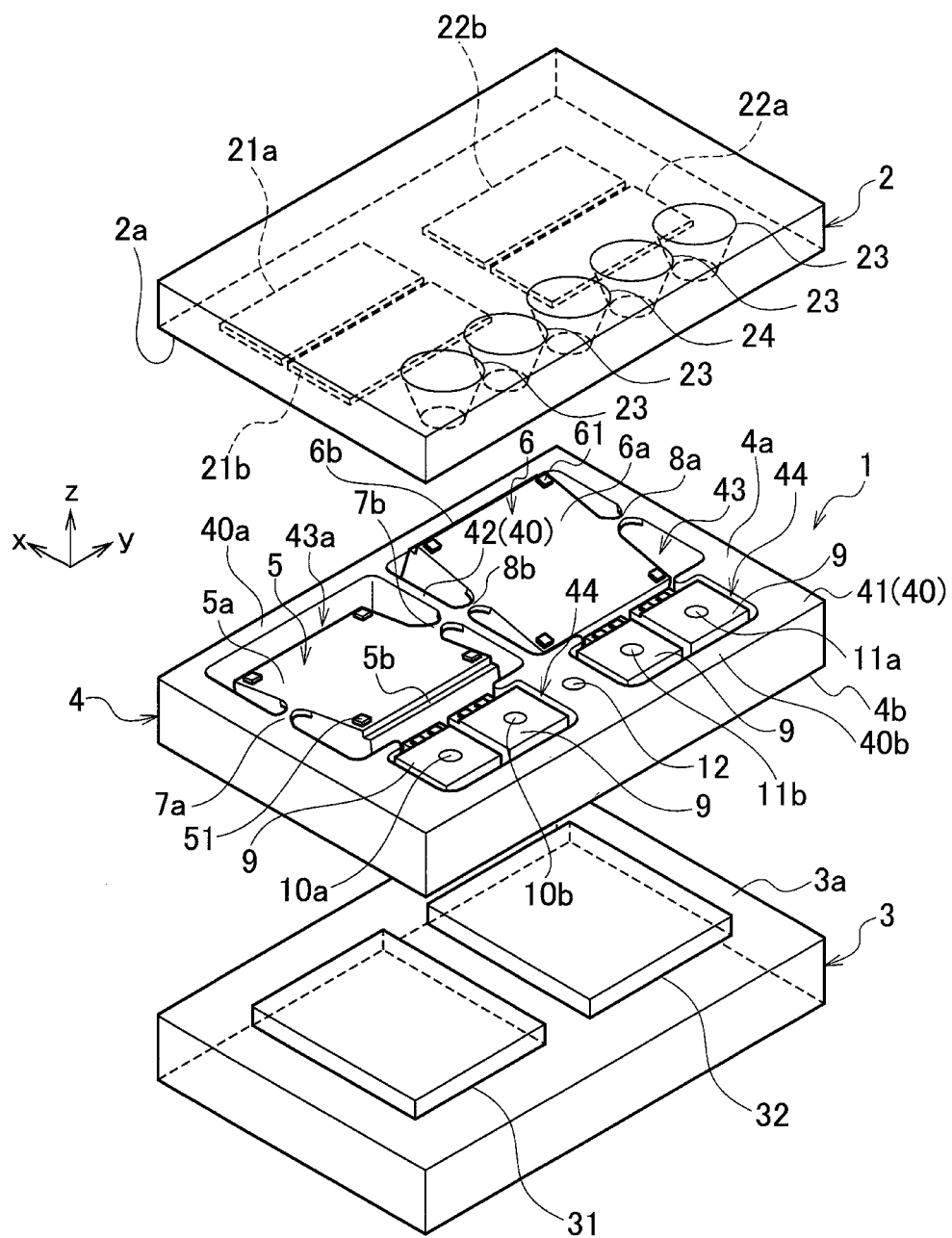
FIG. 1 is an exploded perspective view showing an electrostatic capacitance sensor according to a first embodiment of the present invention.

A description is made below in detail of embodiments of the present invention while referring to the drawings. In the following, acceleration sensors are illustrated as electrostatic capacitance sensors. Moreover, a side of a semiconductor substrate, on which movable electrodes of weight portions are to be formed, are defined to be a front surface of the semiconductor substrate concerned. Then, the description is made on the assumption that a lateral direction of the semiconductor substrate is an X-direction, that a longitudinal direction of the semiconductor substrate is a Y-direction, and that a thickness direction of the semiconductor substrate is a Z-direction.

Moreover, in a plurality of the following embodiments, similar constituents are included. Hence, in the following, common reference numerals are assigned to those similar constituents, and a duplicate description is omitted.

(First Embodiment)

As shown in FIG. 1, an acceleration sensor (electrostatic capacitance sensor) 1 according to this embodiment includes a silicon substrate (semiconductor substrate) 4 in which semiconductor element devices are formed. Then, the acceleration sensor 1 includes a first insulating substrate (first fixing plate) 2 and a second insulating substrate (second fixing plate) 3, which are made of glass and joined to a front surface (one-side surface: one surface) 4a and back surface (other-side surface: other surface) 4b of this silicon substrate 4, respectively. In this embodiment, the silicon substrate 4 and the first and second insulating substrates 2 and 3 are joined to each other by anodic bonding.

Then, on a lower surface (inner surface) 2a of the first insulating substrate 2, fixed electrodes 21a and 21b and fixed electrodes 22a and 22b, which correspond to placed regions of weight portions (movable bodies) 5 and 6, are provided, respectively.

Moreover, on an upper surface (inner surface) 3a of the second insulating substrate 3, antiadhesive films 31 and 32 are formed on regions, which correspond to the placed regions of the weight portions 5 and 6, respectively. For example, the antiadhesive films 31 and 32 can be made of the same material as that of the fixed electrodes 21a, 21b, 22a and 22b.

The silicon substrate 4 includes: a frame portion 40 in which two frame portions 40a and 40b are arrayed in the Y-direction (longitudinal direction of the silicon substrate 4); the weight portions 5 and 6 arranged in the frame portions 40a and 40b in a state where gaps 43 are maintained with respect to inner circumferential surfaces of the frame portions 40a and 40b concerned; a pair of beam portions 7a and 7b and a pair of beam portions 8a and 8b, which support the weight portions 5 and 6, respectively so that the weight portions 5 and 6 can freely move rotationally with respect to the frame portions 40; and movable electrodes 5a and 6a, which are to be formed on front surfaces (one-side surfaces: one surfaces) of the weight portions 5 and 6.

In this embodiment, as this silicon substrate 4, a rectangular SOI substrate is used, in which an embedded insulating layer 112 made of $SiO_2$ is interposed between a silicon active layer 111 made of Si and a support substrate 113 made of Si. Note that a length of a longitudinal side of the silicon substrate 4 is approximately 2 to 4 mm, and a thickness thereof is approximately 0.4 to 0.6 mm. A thickness of the silicon active layer 111 is approximately 10 to 20 μm, and a thickness of the embedded insulating layer 112 is approximately 0.5 μm.

In this embodiment, the frame portion 40 includes: an outer frame portion 41, which has a substantially rectangular shape when viewed in the Z-direction (thickness direction of the silicon substrate 4); and a center frame portion 42, which is extended in the X-direction (lateral direction of the silicon substrate 4), and couples substantially central portions of the outer frame portion 41 in the Y-direction (longitudinal direction of the silicon substrate 4) to each other.

Figure 3:
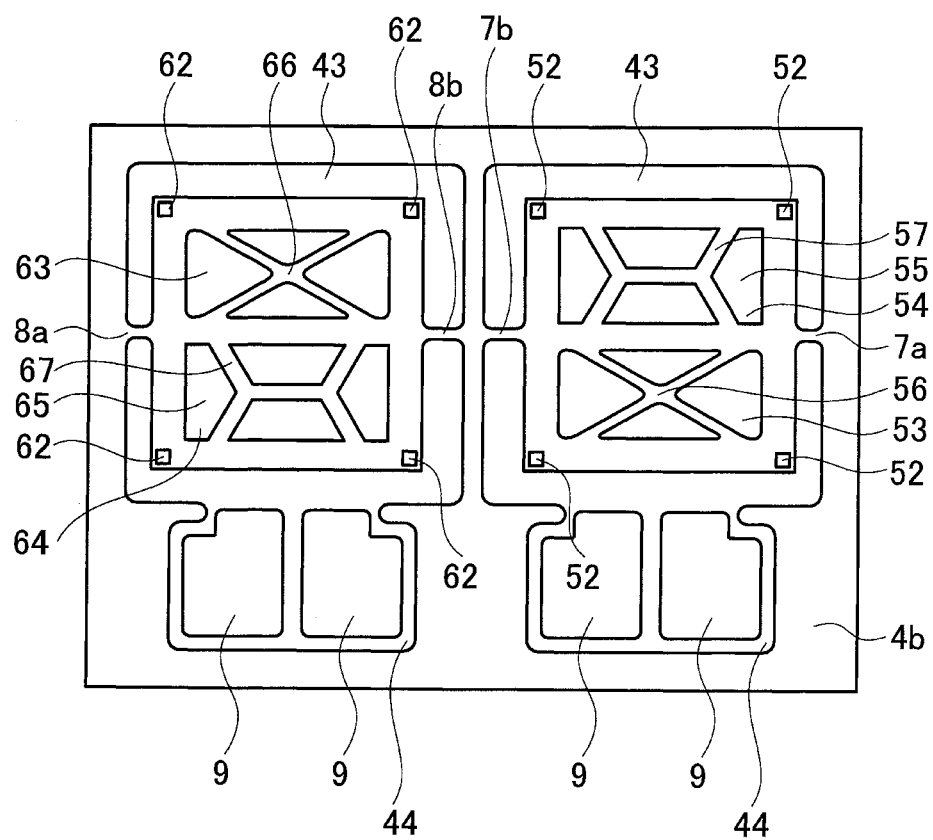
FIG. 3 is a rear view showing the semiconductor substrate according to the first embodiment of the present invention.
Figure 4:
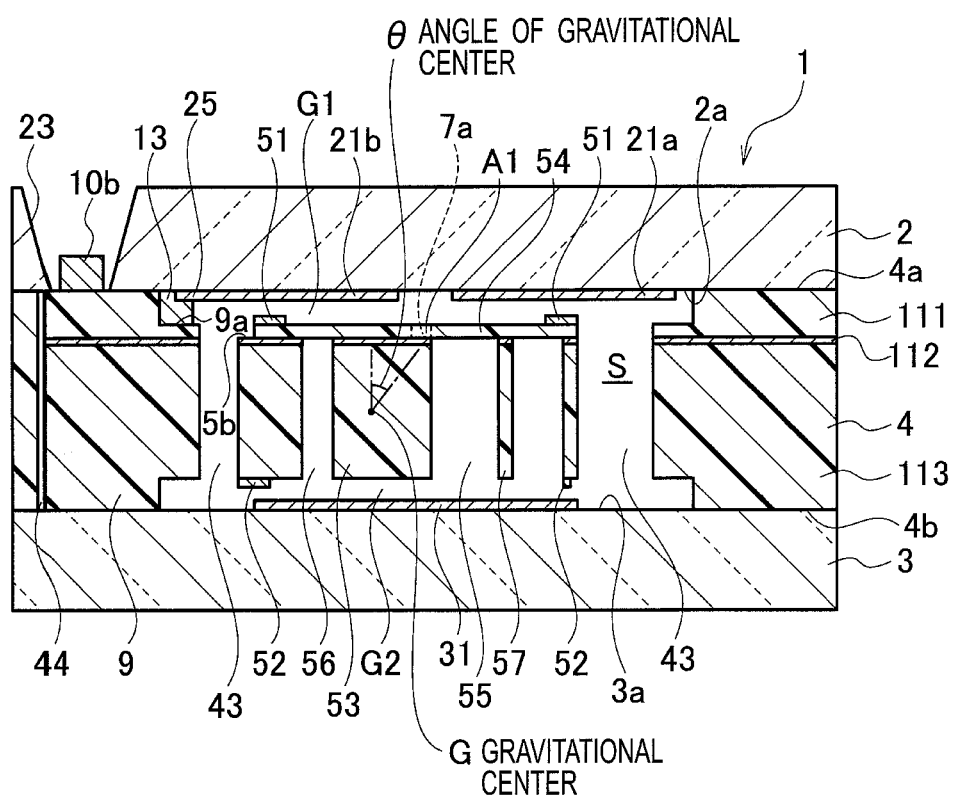
FIG. 4 is a cross-sectional view taken along a line A-A of FIG. 2.

As shown in FIG. 3 and FIG. 4, in the weight portions 5 and 6, recessed portions 55 and 65, which are open to one-side surfaces (back surfaces) thereof, and dense portions 53 and 63, which exclude the recessed portions 55 and 65, are formed integrally with each other. That is to say, in the weight portions 5 and 6, the recessed portions 55 and 65, which are open to the one-side surfaces (back surfaces) thereof, are formed, whereby the thick dense portions 53 and 63 and thin portions 54 and 64 are formed.

As shown in FIG. 4, the dense portions 53 and 63 are formed into a rectangular shape when viewed from the back surface side, and on the respective dense portions 53 and 63, groove portions 56 and 66 in a diagonal line shape are formed perpendicularly to the movable electrodes 5a and 6a.

Moreover, the recessed portions 55 and 65 are each formed into a rectangular shape having sidewalls on four sides thereof. In insides of the recessed portions 55 and 65, reinforcement walls 57 and 67 are provided perpendicularly to the movable electrodes 5a and 6a.

In this embodiment, the recessed portion 55 is formed on one side (depth side in FIG. 1) in the X-direction from a rotation axis A1 to be described later, and in addition, the recessed portion 65 is formed on other side (front side in FIG. 1) in the X-direction from a rotation axis A2 to be described later.

The beam portions 7a and 7b and the beam portions 8a and 8b are formed in the silicon active layer 111 of the SOI substrate (silicon substrate 4), and are formed in such a manner that the silicon active layer 111 is subjected to deep etching by using the embedded insulating layer 112 of the SOI substrate as an etching stop, and further, that the embedded insulating layer 112 is selectively removed by etching.

The beam portions 7a and 7b are individually located on mutually opposite two sides of the front surface (movable electrode 5a) of the weight portion 5, and by the fact that the beam portions 7a and 7b twist, the movable electrode 5a swings about a straight line that connects the beam portions 7a and 7b to each other, the straight line being taken as the rotation axis (axis) A1. In a similar way, the beam portions 8a and 8b are individually located on mutually opposite two sides of the front surface (movable electrode 6a) of the weight portion 6, and the movable electrode 6a swings about a straight line that connects the beam portions 8a and 8b to each other, the straight line being taken as the rotation axis (axis) A2.

Moreover, in this embodiment, in regions of the front surfaces of the weight portions 5 and 6, the regions sharing sides, each of which is one side of the two sides which are not coupled to the beam portions 7a and 7b or the beam portions 8a and 8b, the weight portions 5 and 6 include step portions 5b and 6b, in which a thickness is thinner than other spots of the weight portions 5 and 6, and a plane pattern is band-like. These step portions 5b and 6b are formed by selectively removing the silicon active layer 111 of the silicon substrate 4. Then, the beam portions 7a and 7b are located at midpoints of two sides of the front surface of the weight portion 5, which excludes the step portion 5b, and the beam portions 8a and 8b are located at midpoints of two sides of the front surface of the weight portion 6, which excludes the step portion 6b.

Moreover, in this embodiment, each pair of the weight portion 5 and the weight portion 6, the beam portion 7a and the beam portion 8a, and the beam portion 7b and the beam portion 8b is arranged so as to be point-symmetric to each other with respect to one point (midpoint of a line segment that connects the beam portion 7b and the beam portion 8b to each other) of the silicon substrate 4.

Figure 5:
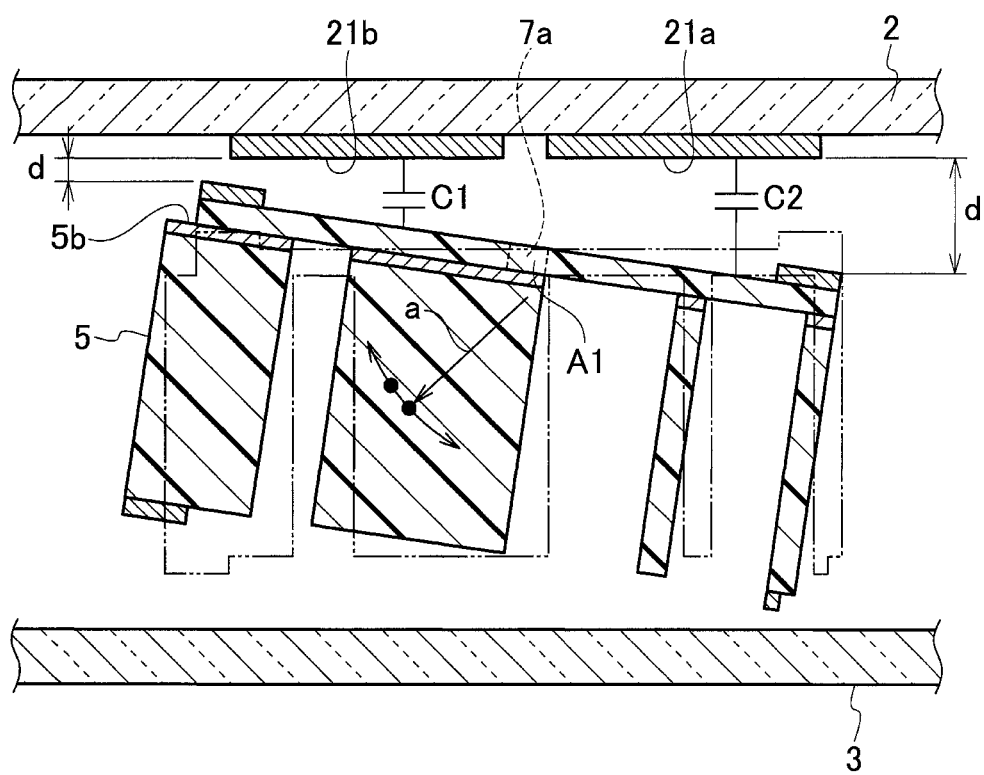
FIG. 5 is an operation explanatory view of the electrostatic capacitance sensor.

Incidentally, in this embodiment, as shown in FIG. 4, the recessed portion 55 is formed on one side from the rotation axis (axis) A1 on a backside of the weight portion 5, and a gravitational center of the weight portion 5 is biased to the other side thereof. In a similar way, the recessed portion 65 is formed on the other side (other side from the rotation axis (axis) A2) on the backside of the weight portion 6, the other side becoming opposite to the one side of the one weight portion 5, on which the recessed portion 55 is provided, and a gravitational center of the weight portion 6 is biased to the one side of the weight portion 6 concerned. Then, when an acceleration is applied to the acceleration sensor 1 in the X-direction or the Z-direction, the acceleration sensor 1 operates as shown in FIG. 5, and is thereby made capable of detecting such acceleration a to be applied thereto in the X-direction or the Z-direction (refer to FIGS. 7A and 7B and FIGS. 8A and 8B).

At this time, for example, while a description is made by taking as an example the weight portion 5 as one of both of the weight portions 5 and 6 with reference to FIG. 4, in the acceleration sensor 1, a setting is made so that an angle made by a perpendicular line drawn down from such a gravitational center G on the side, on which the recessed portion 55 is not formed, to the front surface (movable electrode 5a) of the weight portion 5, and by a straight line that connects the gravitational center G and the rotation axis (axis) A1 to each other, can be approximately 45 degrees. Note that, though the same also applies to the other weight portion 6, the gravitational center position in this case will be present on the opposite side to the gravitational center G of the weight portion 5 while sandwiching the rotation axis (axis) A2 therebetween as mentioned above. If the gravitational center G is arranged as described above, then detection sensitivity in the X-direction and detection sensitivity in the Z-direction become equal to each other, and accordingly, the detection sensitivities in the respective directions can be made substantially the same.

Moreover, on a joint surface between the silicon substrate 4 and the first insulating substrate 2, a relatively shallow gap G1 is formed, and on a joint surface between the silicon substrate 4 and the second insulating substrate 3, a relatively shallow gap G2 is formed. In such a way, insulating properties of the respective portions of the silicon substrate 4 are ensured, and operation performance of each of the weight portions (movable electrodes 5a and 6a) 5 and 6 is ensured. That is to say, the first insulating substrate (first fixing plate) 2 is joined to the front surface (one-side surface: one surface) 4a of the silicon substrate 4, and the second insulating substrate (second fixing plate) 3 is joined to the back surface (other-side surface: other surface) 4b of the silicon substrate 4, whereby a space portion S is formed. Then, by forming this space portion S, the operation performance of each of the weight portions (movable electrodes 5a and 6a) 5 and 6 is ensured.

Note that the gap G2 on the back surface side of the silicon substrate 4 can be formed by removing a part of the silicon substrate 4 by silicon anisotropic etching using an alkaline wet anisotropic etching liquid (for example, KOH (potassium hydroxide solution), TMAH (tetramethyl ammonium hydroxide solution) and the like). At this time, it is suitable to simultaneously form the above-mentioned recessed portions 55 and 65.

Moreover, the gaps 43 and gaps 44 are formed by performing a vertical etching process therefor by RIE (reactive ion etching) and the like. As the reactive ion etching, for example, an ICP (inductively coupled plasma) process by an etching device provided with ICP can be utilized.

Moreover, on corners of the front surfaces of the weight portions 5 and 6, of which number is four per each, protruding portions 51 and 61 for preventing the weight portions 5 and 6 from directly colliding with the fixed electrodes 21a, 21b, 22a and 22b of the first insulating substrate 2 are protruded.

In a similar way, on corners of the back surfaces of the weight portions 5 and 6, of which number is four per each, protruding portions 52 and 62 for preventing the weight portions 5 and 6 from directly colliding with the antiadhesive films 31 and 32 of the second insulating substrate 3 are protruded.

Figure 2:
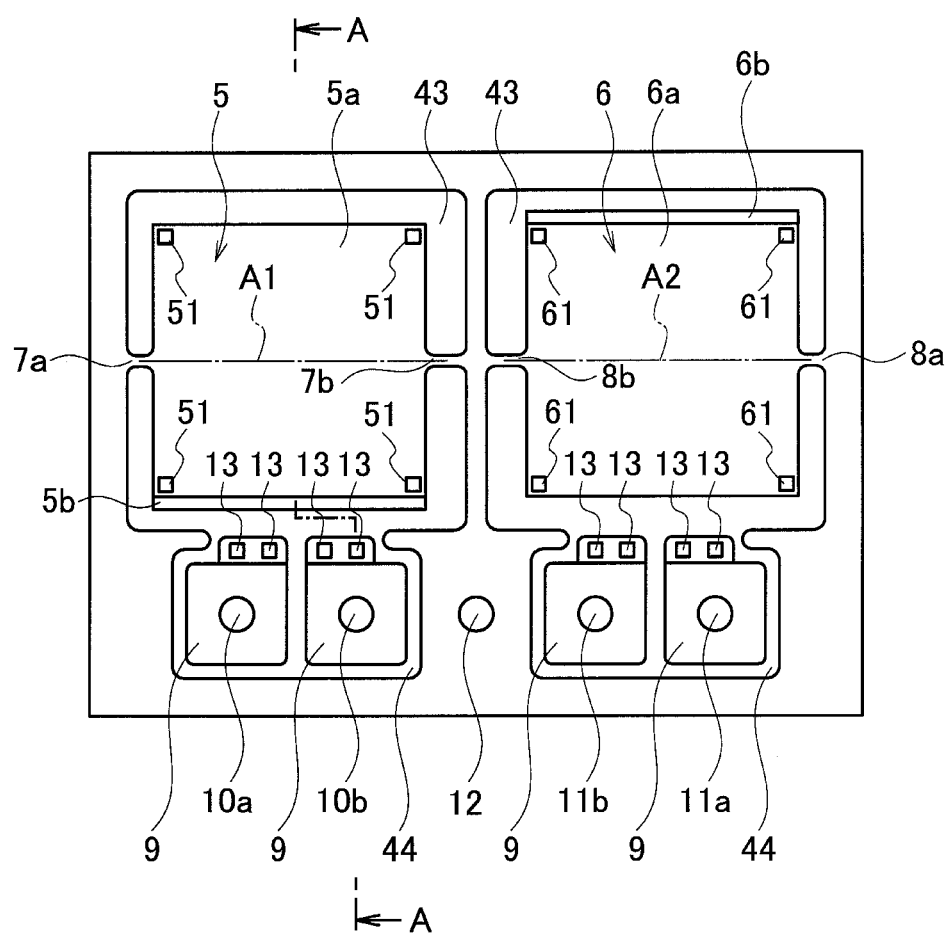
FIG. 2 is a plan view showing a semiconductor substrate according to the first embodiment of the present invention.

Moreover, in this embodiment, one end side (lower side in FIG. 2) of the outer frame portion 41 in the X-direction is formed to be wide, and in the one end side of the outer frame portion 41 in the X-direction, gaps 44 and 44 are formed so as to individually continue with the gaps 43 and 43 in which the weight portions 5 and 6 are arranged. Then, electrode bases 9 are arranged two by two in a state where the gaps 44 are ensured therebetween.

On front surfaces of the electrode bases 9, detection electrodes 10, 10b, 11a and 11b made of metal films are individually provided.

The electrode bases 9 are individually arranged so as to be spaced apart from the frame portion 40 and the weight portions 5 and 6, and upper and lower surfaces thereof are fixed by the first insulating substrate 2 and the second insulating substrate 3. Moreover, on a central portion in the Y-direction of the front surface of the outer frame portion 41, a common electrode 12 to be wired to an outside of the acceleration sensor 1 is provided, and the frame portion 40 is set at a common potential.

As mentioned above, on the lower surface of the first insulating substrate 2, the fixed electrodes 21a and 21b and the fixed electrodes 22a and 22b, which correspond to the placed regions of the weight portions 5 and 6, are provided, respectively. These respective fixed electrodes 21a and 21b and fixed electrodes 22a and 22b are formed so that shapes thereof can be substantially the same and that areas thereof can be substantially the same.

The fixed electrodes 21a and 21b are arranged apart from each other while taking as a boundary line the straight line (rotation axis A1) that connects the beam portions 7a and 7b to each other. In a similar way, the fixed electrodes 22a and 22b are arranged apart from each other while taking as a boundary line the straight line (rotation axis A2) that connects the beam portions 8a and 8b to each other. In this embodiment, the respective fixed electrodes 21a and 21b and fixed electrodes 22a and 22b are formed by depositing aluminum on the first insulating substrate 2 by the sputtering method, the CVD method and the like.

The fixed electrodes 21a and 21b are electrically connected to the detection electrodes 10a and 10b, respectively, and the fixed electrodes 22a and 22b are electrically connected to the detection electrodes 11a and 11b, respectively.

Specifically, on the fixed electrodes 21a and 21b and the fixed electrodes 22a and 22b, leads (fixed electrode-side metal contact portions) 25 are individually provided toward the fixed electrode bases 9 on which the detection electrodes 10a and 10b and the detection electrodes 11a and 11b are formed. Here, the fixed electrodes 21a and 21b and the fixed electrodes 22a and 22b are connected to the detection electrodes 10a and 10b and the detection electrodes 11a and 11b, respectively.

Moreover, on the respective fixed electrode bases 9, aluminum-made conductive layers (semiconductor substrate-side metal contact portions) 13, with which the leads (fixed electrode-side metal contact portions) 25 are to be brought into contact, are formed. In this embodiment, step differences 9a are provided on other end-side (upper side in FIG. 2: weight portion side) in the X-direction of the respective fixed electrode bases 9, and the conductive layers (semiconductor substrate-side metal contact portions) 13 are formed on lower surfaces of the step differences 9a, that is, at positions lower than surfaces on which the detection electrodes 10a and 10b and the detection electrodes 11a and 11b are to be formed (refer to FIG. 4).

Then, the leads (fixed electrode-side metal contact portions) 25 and the conductive layers (semiconductor substrate-side metal contact portions) 13 are brought into contact with each other by being stamped to each other in the event where the silicon substrate 4 and the first insulating substrate 2 are joined to each other by the anodic bonding.

In such a way, the fixed electrodes 21a and 21b and the fixed electrodes 22a and 22b are electrically connected to the detection electrodes 10a and 10b and the detection electrodes 11a and 11b.

Note that the detection electrodes 10a and 10b and the detection electrodes 11a and 11b are spaced apart from each other, and are individually spaced apart from the frame portion 40 and the weight portions 5 and 6, and accordingly, the respective detection electrodes are insulated from each other, and electrostatic capacitances of the respective detection electrodes and a crosstalk among the respective detection electrodes are reduced, whereby capacitance detection with high accuracy can be performed.

Moreover, in spots of the first insulating substrate 2, which correspond to the electrodes bases 9, through holes 23 are individually formed by a sandblasting process and the like, and in a spot of the first insulating substrate 2, which corresponds to the common electrode 12, a through hole 24 is formed. Then, the detection electrodes 10a and 10b and the detection electrodes 11a and 11b are individually exposed and wired to the outside through the through holes 23, and the common electrode 12 is exposed and wired to the outside through the through hole 24. In such a way, it is made possible to take out potentials of the fixed electrodes 21a, 21b, 22a and 22b and the movable electrodes 5a and 6a to the outside.

In the acceleration sensor 1 configured as described above, when an acceleration shown by an arrow a in FIG. 5 is applied thereto, then both of the weight portions 5 and 6 swing and move, gaps d between both end sides of the weight portions 5 and 6 and the fixed electrodes 21a, 21b, 22a and 22b are changed, and electrostatic capacitances C1, C2, C3 and C4 in these gaps d are changed. Note that FIG. 5 illustrates the weight portion 5 as one of the pair.

It is known that, in such an electrostatic capacitance C at this time, the following expression is established: $C=\varepsilon \times S/d$ (s: dielectric constant; S: electrode area; d: gap). In accordance with this expression, the electrostatic capacitance C is decreased when the gap d is increased, and the electrostatic capacitance C is increased when the gap d is decreased.

Figure 6:
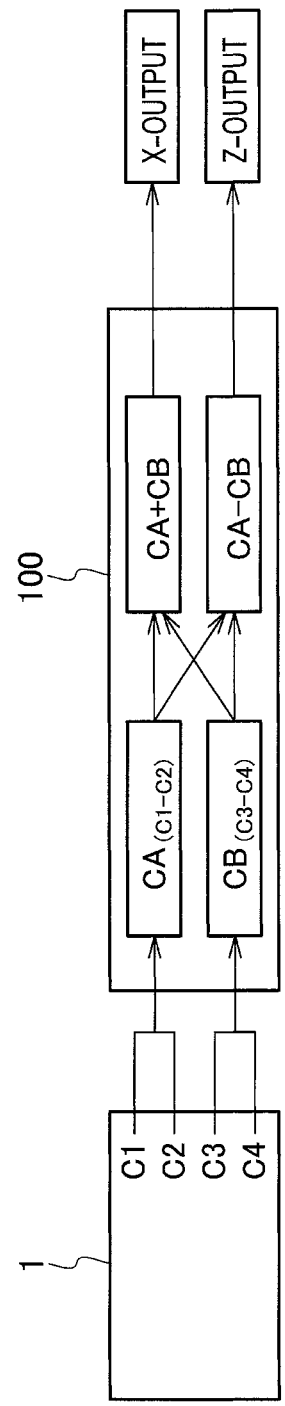
FIG. 6 is a system configuration diagram of the electrostatic capacitance sensor.
Figure 7A:
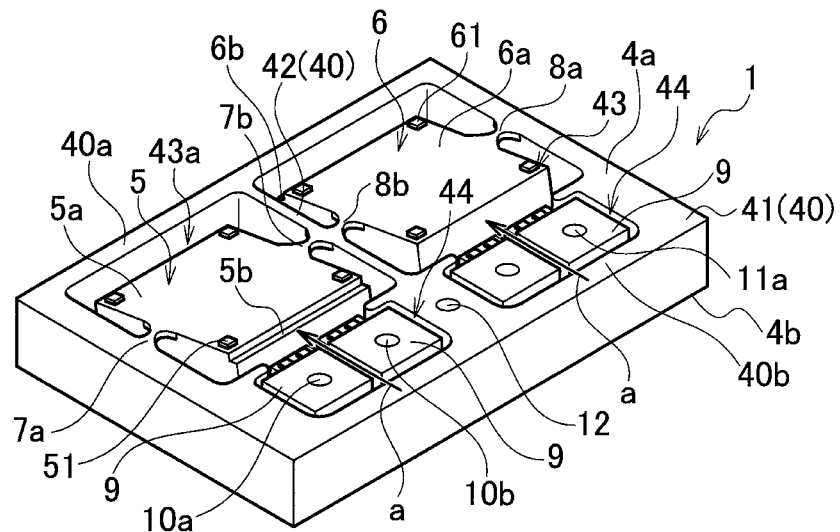
FIGS. 7A and 7B are explanatory views schematically showing a detection principle of an acceleration applied to the electrostatic capacitance sensor in an X-direction.
Figure 7B:
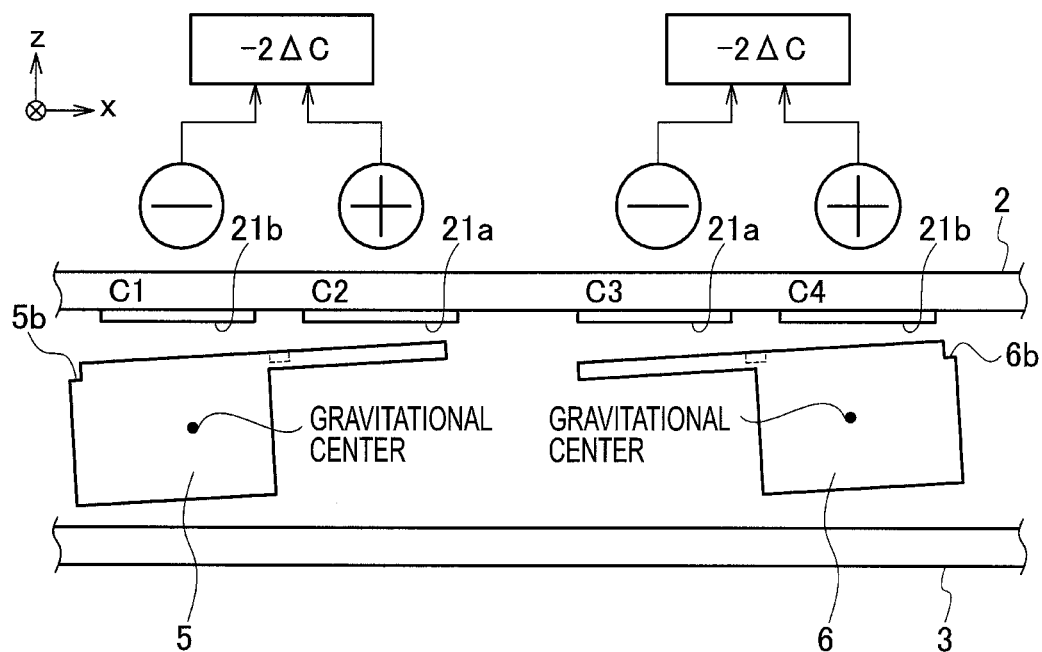
Figure 8A:
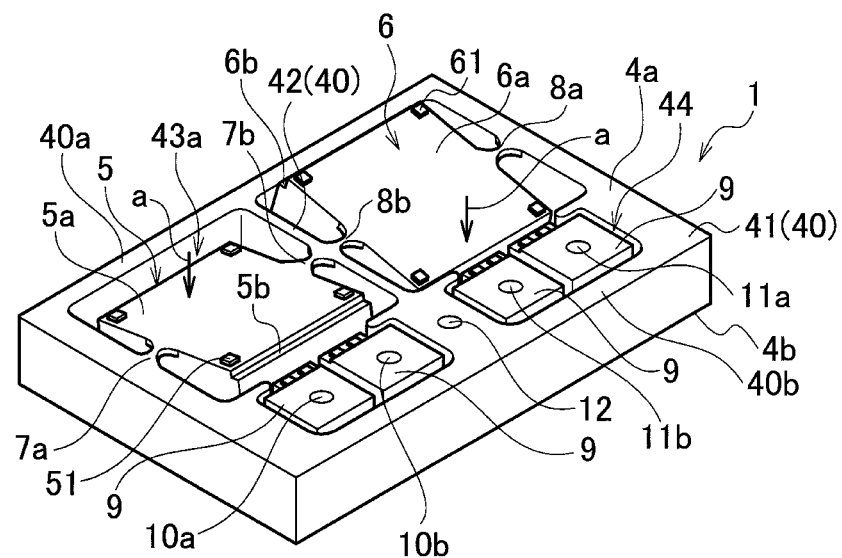
FIGS. 8A and 8B are explanatory views schematically showing a detection principle of an acceleration applied to the electrostatic capacitance sensor in a Z-direction.
Figure 8B:
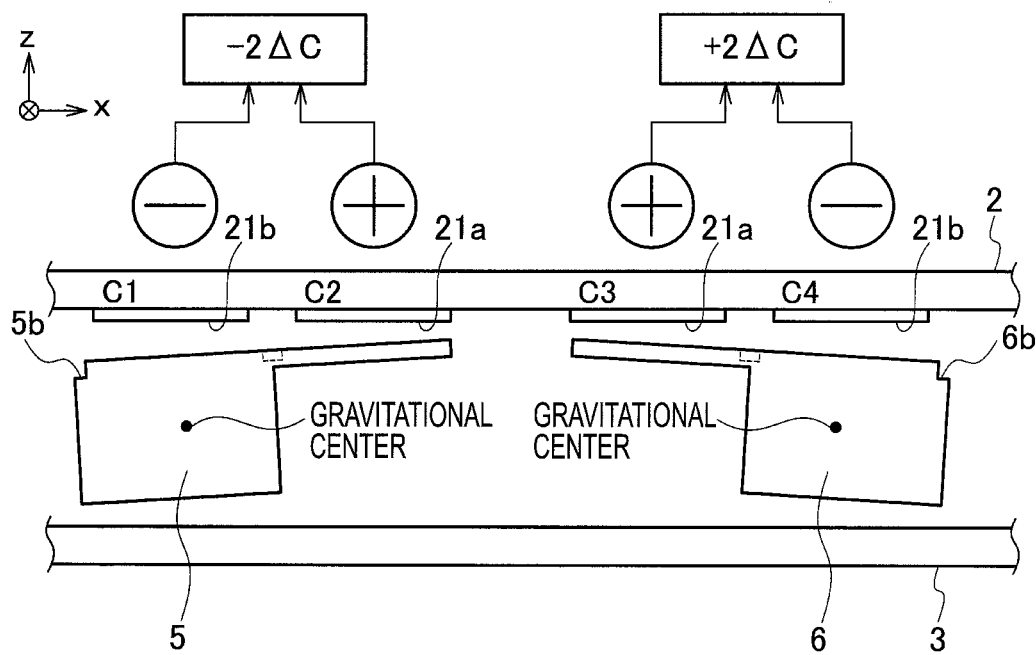

Then, as shown in a system configuration diagram of FIG. 6, in the acceleration sensor 1, the detected electrostatic capacitances C1, C2, C3 and C4 are sent to an arithmetic circuit 100 composed, for example, of an ASIC, the acceleration in the X-direction and the acceleration in the Z-direction are obtained, and data indicating the accelerations concerned are outputted. At this time, arithmetic expressions to be executed in the arithmetic circuit 100 are those shown in FIG. 9, and a direction of the acceleration a is decided based on differences between the electrostatic capacitances C1, C2, C3 and C4 obtained by the application of the acceleration a in the X-direction, which is shown in FIGS. 7A and 7B, and by the application of the acceleration a in the Z-direction, which is shown in FIGS. 8A and 8B. Note that a parameter C0 in the expressions to be shown below indicates electrostatic capacitances between the weight portions 5 and 6 and the fixed electrodes 21a and 21b and the fixed electrodes 22a and 22b in a state where the acceleration a is not applied.

Then, in the case where the acceleration a is applied in a +X-direction (refer to FIGS. 7A and 7B, both of the weight portions 5 and 6 swing in the same direction, and accordingly, the following relationships are established: $C1=C0+\Delta C$; $C2=C0-\Delta C$; $C3=C0+\Delta C$; and $C4=C0-\Delta C$. Moreover, in the case where the acceleration a is applied in a −X-direction, a swing direction of both of the weight portions 5 and 6 is reversed to that when the applied direction of the acceleration a is the +X-direction, and accordingly, the following relationships are established: $C1=C0-\Delta C$; $C2=C0+\Delta C$; $C3=C0-\Delta C$; and $C4=C0+\Delta C$.

Meanwhile, in the case where the acceleration a is applied in the +Z-direction, (refer to FIGS. 8A and 8B, both of the weight portions 5 and 6 swing in directions reverse to each other, and accordingly, the following relationships are established: $C1\ C0-\Delta C$; $C2=C0+\Delta C$; $C3=C0+\Delta C$; and $C4=C0-\Delta C$. Moreover, in the case where the acceleration a is applied in a −Z-direction, swing directions of both of the weight portions 5 and 6 are reversed to those when the applied direction of the acceleration a is the +Z-direction, and accordingly, the following relationships are established: $C1=C0+\Delta C$; $C2=C0-\Delta C$; $C3=C0-\Delta C$; and $C4=C0+\Delta C$.

Hence, such an electrostatic difference CA ($=C1-C2$) between the weight portion 5 as one of the pair and the fixed electrodes 21a and 21b becomes +20 C in the +X-direction, −20 C in the −X-direction, −20 C in the +Z-direction, and +20 C in the −Z-direction. Moreover, such an electrostatic difference CB ($=C3-C4$) between the weight portion 6 as the other of the pair and the fixed electrodes 22a and 22b becomes +20 C in the +X-direction, −20 C in the −X-direction, +20 C in the +Z-direction, and −20 C in the −Z-direction.

Here, the output in the X-direction can be obtained as the sum of both of the differences CA and CB, and the output in the Z-direction can be obtained as a difference between both of the differences CA and CB. In such a way, the output in the X-direction becomes +40 C in the case where the acceleration a in the +X-direction is applied, and becomes −40 C in the case where the acceleration a in the −X-direction is applied. Moreover, the output in the Z-direction becomes −40 C in the case where the acceleration a in the +Z-direction is applied, and becomes +40 C in the case where the acceleration a in the −Z-direction is applied.

Incidentally, as shown in FIG. 1, in the acceleration sensor 1 of this embodiment, the first acceleration sensor, which is single and includes the weight portion 5 as one of the pair, and the second acceleration sensor, which is single and includes the weight portion 6 as the other of the pair, are arranged in inside of the same chip plane, and in addition, the respective single acceleration sensors are arranged in a state of rotating by 180 degrees relatively with respect to each other. As described above, such a first single acceleration sensor and such a second single acceleration sensor are arranged so that the gravitational center position of the weight portion 5 in the first acceleration sensor, the weight portion 5 being one of the pair, and the gravitational center position of the weight portion 6 in the second acceleration sensor, the weight portion 6 being the other of the pair, can be located in the opposite sides to each other with respect to the rotation axes (axes) A1 and A2, whereby it is made possible to detect the accelerations a in the X-direction and the Z-direction.

Here, in this embodiment, in the electrostatic capacitance sensor 1, there is provided static electricity suppressing means 70 for suppressing static electricity from being generated in the space portion S.

Figure 10:
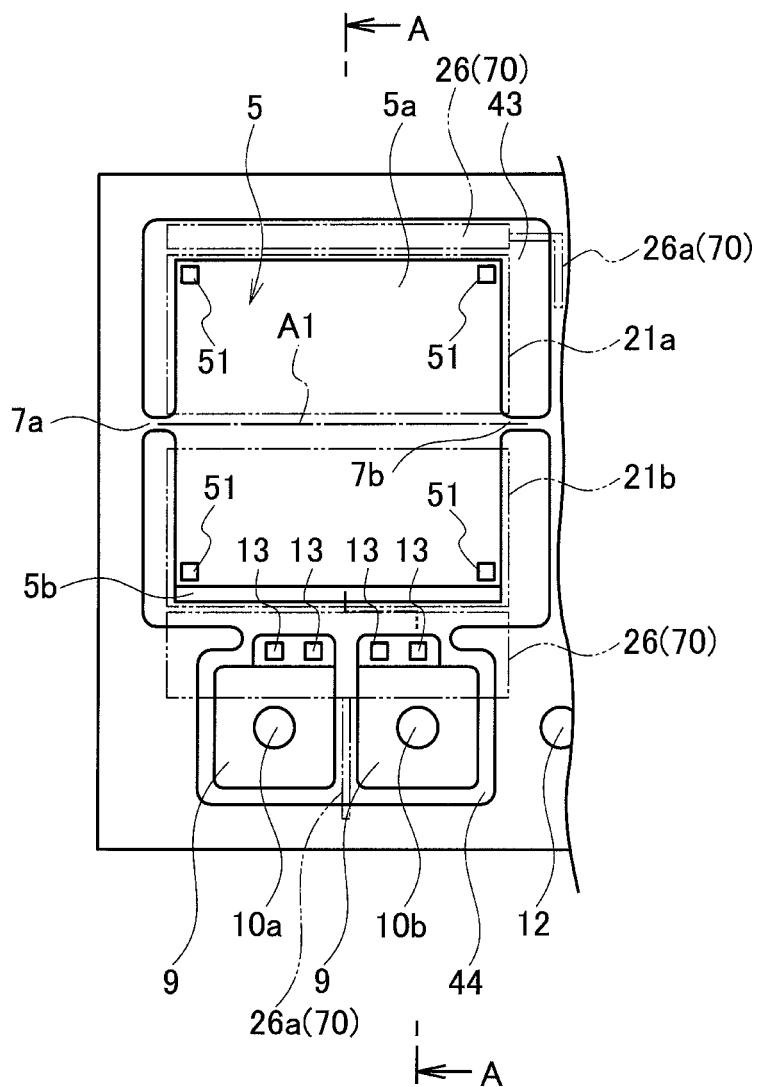
FIG. 10 is an explanatory view schematically explaining correspondences of fixed electrodes and auxiliary electrodes to a semiconductor substrate in the electrostatic capacitance sensor according to the first embodiment of the present invention.
Figure 11:
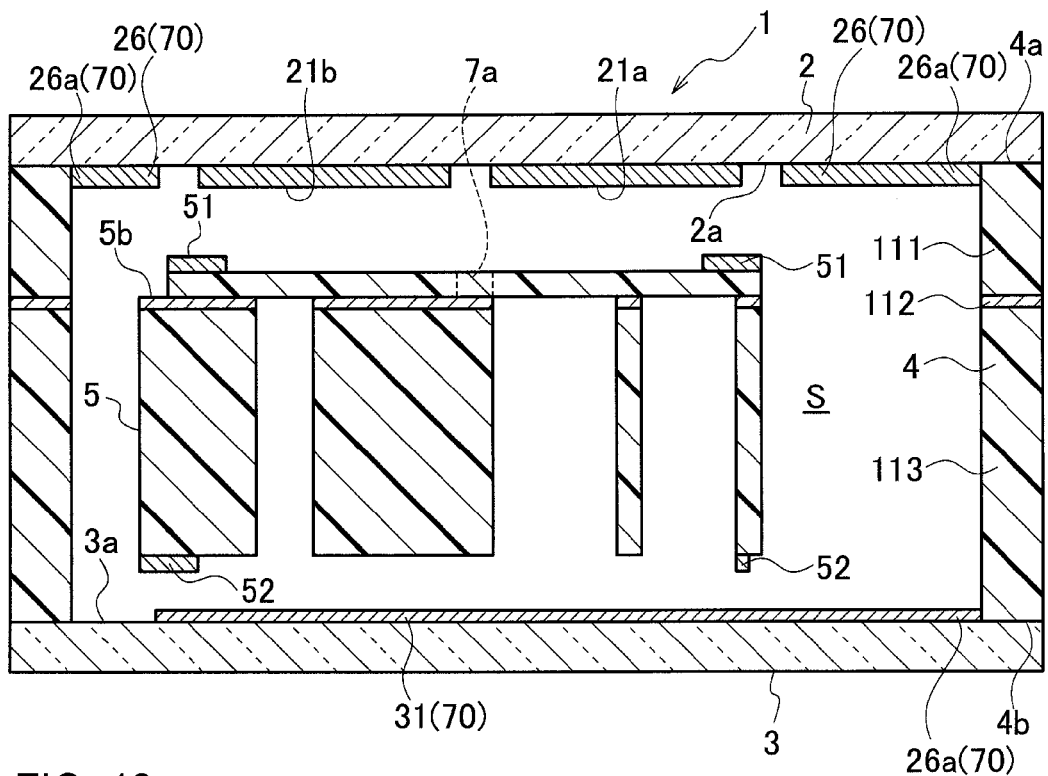
FIG. 11 is a cross-sectional view schematically showing the electrostatic capacitance sensor according to the first embodiment of the present invention.

Specifically, as shown in FIG. 10, metal films 26 are formed on spots of the lower surface (inner surface) 2a of the first insulating substrate 2, which are other than the spots on which the fixed electrodes 21a and 21b and the fixed electrodes 22a and 22b are formed, and the metal films 26 concerned are used as the static electricity suppressing means 70.

These metal films 26 are individually provided on the outsides in the X-direction of the pair of fixed electrodes 21a and 21b, and are brought into contact with the frame portion 40 through wires 26a. That is to say, the metal films 26 are electrically connected to the weight portion (movable body) 5 through the wires 26a and the frame portion 40. Meanwhile, the metal films 26 do not contact the fixed electrodes 21a and 21b, and are electrically insulated from the fixed electrodes 21a and 21b. Note that, though not shown, similar metal films 26 are also formed on the weight portion 6.

Moreover, in this embodiment, the antiadhesive films (metal films) 31 and 32 formed on the upper surface (inner surface) 3a of the second insulating substrate 3 are also used as the static electricity suppressing means 70. That is to say, the antiadhesive films (metal films) 31 and 32 formed so as to be opposite to the back surfaces of the weight portions (movable bodies) 5 and 6 are electrically connected to the weight portions (movable bodies) 5 and 6 concerned through the wires 26a and the frame portion 40. These antiadhesive films (metal films) 31 and 32 are also electrically insulated from the fixed electrodes 21a and 21b and the fixed electrodes 22a and 22b.

As described above, in this embodiment, in the electrostatic capacitance sensor 1, there is provided the static electricity suppressing means 70 for suppressing the static electricity from being generated in the space portion S.

Specifically, the metal films (including the antiadhesive films) 26 are formed on at least the spots of the lower surface (inner surface) 2a of the first insulating substrate (first fixing plate) 2, which are other than the spots on which the fixed electrodes 21a and 21b and the fixed electrodes 22a and 22b are formed, and the upper surface (inner surface) 3a of the second insulating substrate (second fixing plate) 3. In such a way, opposite areas of the front surfaces of the weight portions (movable bodies) 5 and 6 and the lower surface (inner surface) 2a of the first insulating substrate and opposite areas (areas of exposed portions) of the back surfaces of the weight portions (movable bodies) 5 and 6 and the upper surface (inner surface) 3a of the second insulating substrate 3 are reduced. Then, the metal films 26 and the antiadhesive films (metal films) 31 and 32, which reduce the opposite areas (areas of the exposed portions), are electrically connected to the weight portions (movable bodies) 5 and 6, and are set at the same potential as that of the weight portions (movable bodies) 5 and 6.

As described above, on the opposite portions to the weight portions (movable bodies) 5 and 6, the metal films 26 set at the same potential as that of the weight portions (movable bodies) 5 and 6 concerned are formed, whereby the opposite areas to electrically unstable glass (insulator) are reduced. Therefore, potential differences can be suppressed from being generated between the front surfaces of the weight portions (movable bodies) 5 and 6 and the lower surface (inner surface) 2a of the first insulating substrate 2, and between the back surfaces of the weight portions (movable bodies) 5 and 6 and the upper surface (inner surface) 3a of the second insulating substrate 3. As a result, the generation of the static electricity, which is caused by the potential difference between the weight portions (movable bodies) 5 and 6 and the first insulating substrate (first fixing plate) 2 and by the potential difference between the weight portions (movable bodies) 5 and 6 and the second insulating substrate (second fixing plate) 3, can be suppressed, whereby it is made possible to suppress unexpected variations of attitudes of the weight portions (movable bodies) 5 and 6, and the detection accuracy of the electrostatic capacitance sensor 1 can be suppressed from being lowered.

At this time, the metal films 26 and the antiadhesive films (metal films) 31 and 32 are electrically insulated from the fixed electrodes 21a and 21b and the fixed electrodes 22a and 22b, and accordingly, potential differences can be generated between the weight portions (movable bodies) 5 and 6 and the fixed electrodes 21a and 21b and the fixed electrodes 22a and 22b.

Therefore, the metal films 26 and the antiadhesive films (metal films) 31 and 32 can be suppressed from impairing the functions of the sensor. Specifically, it is made possible to suppress the lowering of the detection accuracy of the electrostatic capacitance sensor 1, which may be caused by the fact that the metal films 26 and the antiadhesive films (metal films) 31 and 32 are formed.

(Second Embodiment)

An acceleration sensor 1A according to this embodiment basically has similar configurations to those of the acceleration sensor 1 of the above-described first embodiment.

Specifically, in the acceleration sensor 1A, the first insulating substrate (first fixing plate) 2 is joined to a front surface (one-side surface: one surface) 4a of a silicon substrate 4A, and the second insulating substrate (second fixing plate) 3 is joined to a back surface (other-side surface: other surface) 4b of the silicon substrate 4A, whereby the space portion S is formed.

Then, the static electricity suppressing means 70 for suppressing the static electricity from being generated in the space portion S is provided.

Also in this embodiment, the metal films (including the antiadhesive films 31 and 32 and the wires 26a) 26 are used as the static electricity suppressing means 70.

Here, the acceleration sensor 1A according to this embodiment is different from the acceleration sensor 1 of the above-described first embodiment mainly in that the weight portions (movable bodies) 5 and 6 are formed without using the insulator.

Figure 12:
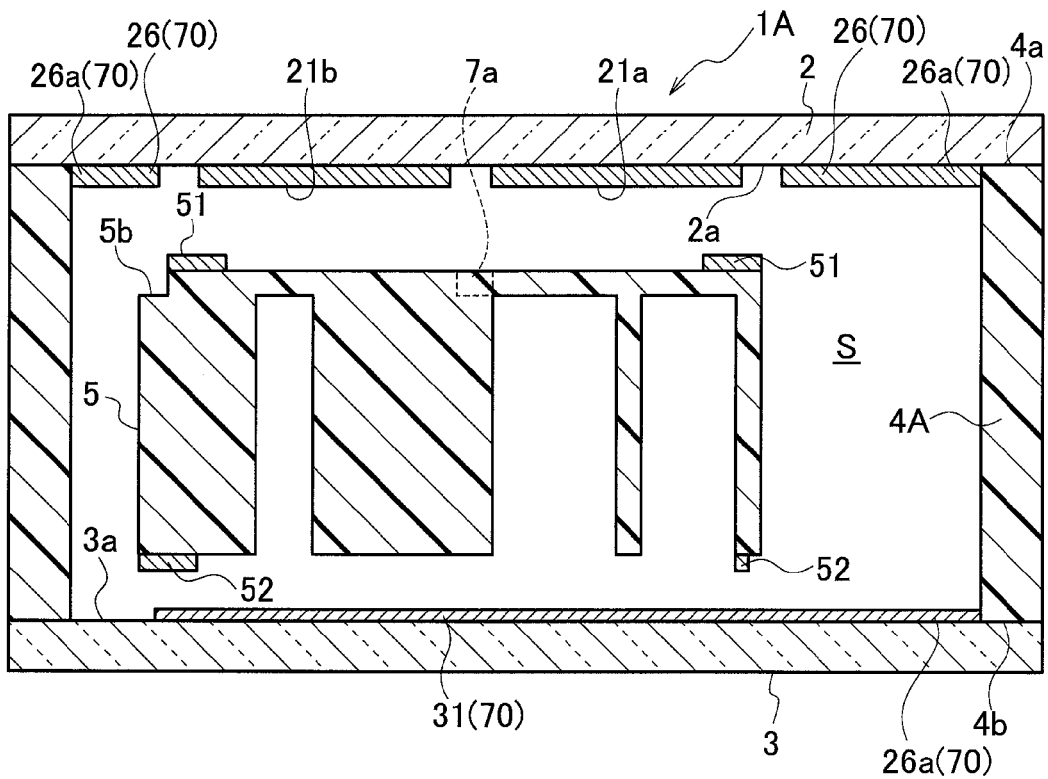
FIG. 12 is a cross-sectional view schematically showing an electrostatic capacitance sensor according to a second embodiment of the present invention.

In this embodiment, as shown in FIG. 12, the weight portions (movable bodies) 5 and 6 and the frame portion 40 are formed not by using the SOI substrate but by using the silicon substrate (semiconductor substrate) 4A made of Si.

As described above, the weight portions (movable bodies) 5 and 6 are formed without using the insulator, whereby a structure of the weight portions (movable bodies) 5 and 6 is formed into a structure that is not electrically divided.

Also in accordance with this embodiment described above, similar functions and effects to those of the above-described first embodiment can be exerted.

Moreover, in accordance with this embodiment, the weight portions (movable bodies) 5 and 6 are formed without using the insulator. As described above, the weight portions (movable bodies) 5 and 6 are formed without using the insulator, whereby the structure of the weight portions (movable bodies) 5 and 6 can formed into the structure that is not electrically divided, and potential differences can be suppressed from being generated between upper and lower portions of the weight portions (movable bodies) 5 and 6 concerned. Hence, generation of static electricity, which may be caused by the potential differences generated between the upper and lower portions of the weight portions (movable bodies) 5 and 6, can be suppressed, and it is made possible to suppress the unexpected variations of the attitudes of the weight portions (movable bodies) 5 and 6. As a result, the detection accuracy of the electrostatic capacitance sensor 1A can be suppressed from being lowered.

(Third Embodiment)

An acceleration sensor 1B according to this embodiment basically has similar configurations to those of the acceleration sensor 1A of the above-described second embodiment.

That is to say, in the acceleration sensor 1B, the first insulating substrate (first fixing plate) 2 is joined to the front surface (one-side surface: one surface) 4a of the silicon substrate 4A, and the second insulating substrate (second fixing plate) 3 is joined to the back surface (other-side surface: other surface) 4b of the silicon substrate 4A, whereby the space portion S is formed.

Moreover, the weight portions (movable bodies) 5 and 6 are formed without using the insulator.

Then, the static electricity suppressing means 70 for suppressing the static electricity from being generated in the space portion S is provided.

Also in this embodiment, the metal films (including the antiadhesive films 31 and 32 and the wires 26a) 26 are used as the static electricity suppressing means 70.

Here, the acceleration sensor 1B according to this embodiment is different from the acceleration sensor 1A of the above-described second embodiment mainly in that the metal films 26 are formed on recessed portions 2b formed on the lower surface (inner surface) 2a of the first insulating substrate (first fixing plate) 2.

Figure 13:
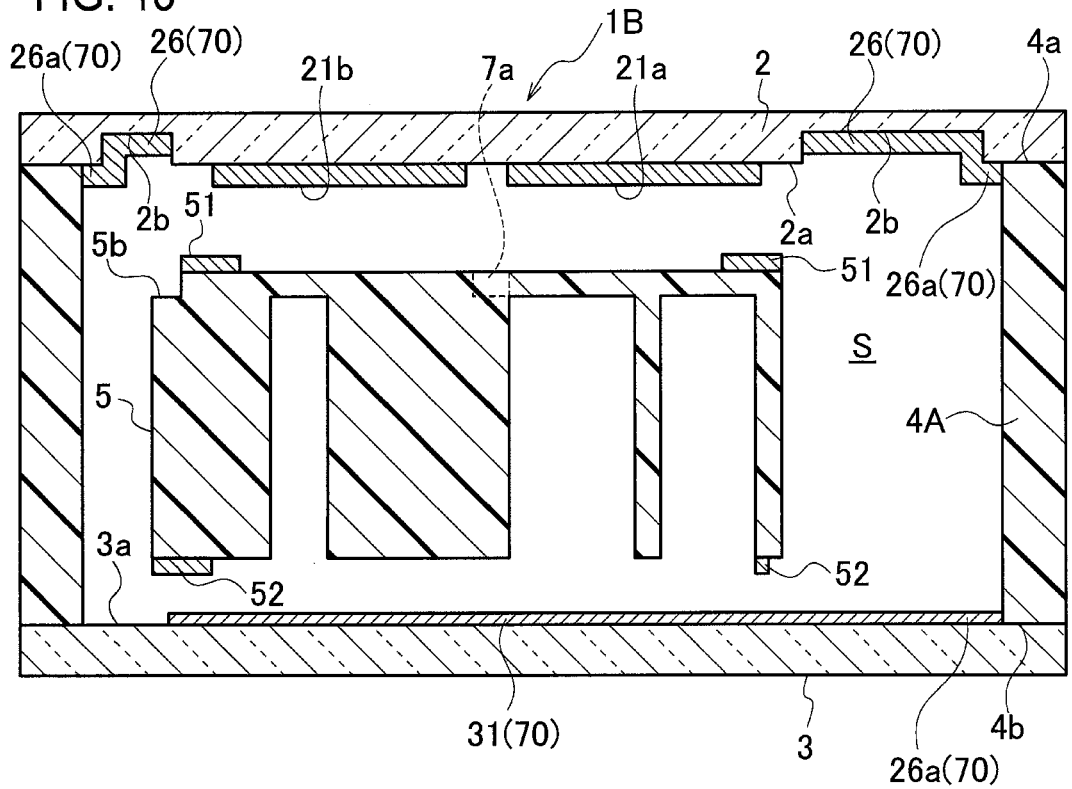
FIG. 13 is a cross-sectional view schematically showing an electrostatic capacitance sensor according to a third embodiment of the present invention.

In this embodiment, as shown in FIG. 13, the recessed portions 2b are formed on the spots of the lower surface (inner surface) 2a of the first insulating substrate (first fixing plate) 2, which are other than the spots on which the fixed electrodes 21a and 21b and the fixed electrodes 22a and 22b are formed, and then the metal films 26 are formed on the recessed portions 2b. Note that it is preferable to set a depth of the recessed portions 2b at 3 μm or more.

As described above, the metal films 26 are formed on the recessed portions 2b, whereby a distance between the weight portions (movable bodies) 5 and 6 and the first insulating substrate (first fixing plate) 2, that is, a distance to the weight portions 5 and 6 from the spots of the first insulating substrate 2, which are other than the spots on which the fixed electrodes 21a and 21b and the fixed electrodes 22a and 22b are formed, is increased.

Also in accordance with this embodiment described above, similar functions and effects to those of the above-described second embodiment can be exerted.

Moreover, in accordance with this embodiment, the metal films 26 are formed on the recessed portions 2b formed on the lower surface (inner surface) 2a of the first insulating substrate (first fixing plate) 2. Therefore, the distance between the weight portions (movable bodies) 5 and 6 and the first insulating substrate (first fixing plate) 2, that is, the distance to the weight portions 5 and 6 from the spots of the first insulating substrate 2, which are other than the spots on which the fixed electrodes 21a and 21b and the fixed electrodes 22a and 22b are formed, can be increased. As described above, the distance from the first insulating substrate 2 to the weight portions (movable bodies) 5 and 6 is increased, whereby it is made possible to further reduce such an influence of the static electricity, which is given to the weight portions (movable bodies) 5 and 6. As a result, it is made possible to suppress the unexpected variations of the attitudes of the weight portions (movable bodies) 5 and 6, and the detection accuracy of the electrostatic capacitance sensor 1B can be suppressed from being lowered.

(Fourth Embodiment)

An acceleration sensor 1C according to this embodiment basically has similar configurations to those of the acceleration sensor 1A of the above-described second embodiment.

That is to say, in the acceleration sensor 1C, the first insulating substrate (first fixing plate) 2 is joined to the front surface (one-side surface: one surface) 4a of the silicon substrate 4A, and a second fixing plate 3C is joined to the back surface (other-side surface: other surface) 4b of the silicon substrate 4A, whereby the space portion S is formed.

Moreover, the weight portions (movable bodies) 5 and 6 are formed without using the insulator.

Then, the static electricity suppressing means 70 for suppressing the static electricity from being generated in the space portion S is provided.

Here, the acceleration sensor 1C according to this embodiment is different from the acceleration sensor 1A of the above-described second embodiment mainly in that the second fixing plate 3C is composed of a conductor.

Figure 14:
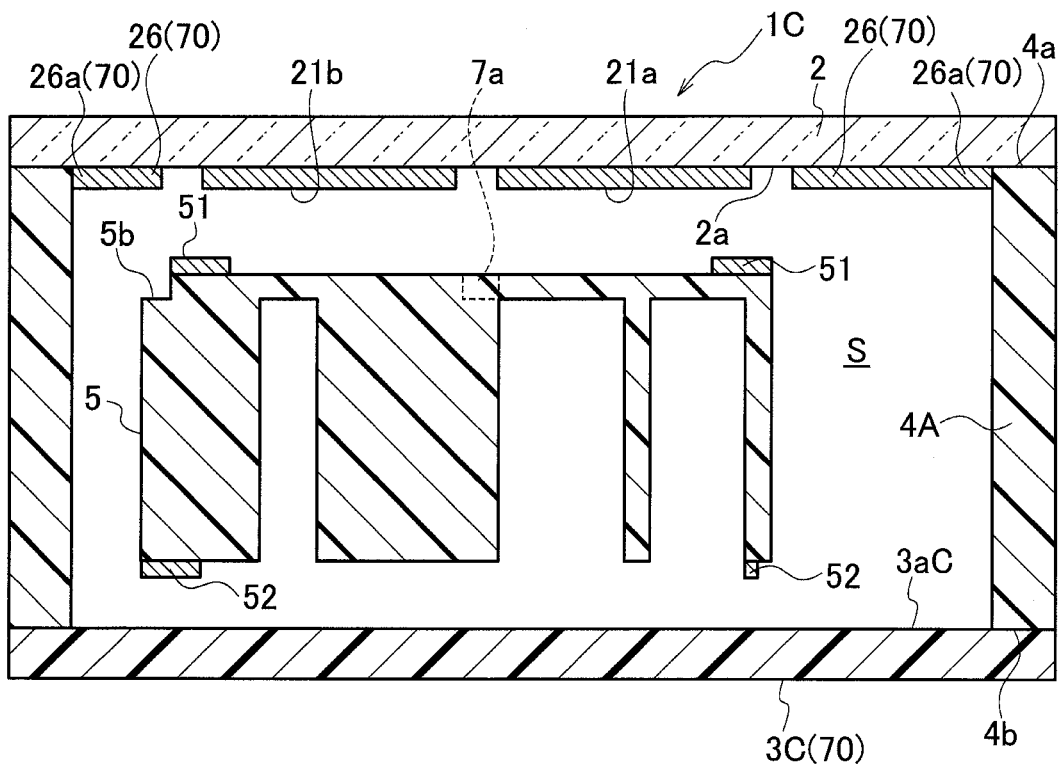
FIG. 14 is a cross-sectional view schematically showing an electrostatic capacitance sensor according to a fourth embodiment of the present invention.

In this embodiment, as shown in FIG. 14, the second fixing plate 3C is formed by using a silicon substrate made of Si. In the event of being joined to the silicon substrate 4A, this second fixing plate 3C is electrically connected to the silicon substrate 4A concerned, and accordingly, an upper surface (inner surface) 3aC of the second fixing plate 3C is electrically connected to the weight portions (movable bodies) 5 and 6, and is set at the same potential as that of the weight portions (movable bodies) 5 and 6 concerned.

Hence, in this embodiment, an antiadhesive film is not formed on the upper surface (inner surface) 3aC of the second fixing plate 3C.

That is to say, in this embodiment, the second fixing plate 3C and the metal films (including the wires 26a) 26 formed on the spots of the lower surface (inner surface) 2a of the first insulating substrate 2, which are other than the spots on which the fixed electrodes 21a and 21b and the fixed electrodes 22a and 22b are formed, are used as the static electricity suppressing means 70.

Also in accordance with this embodiment described above, similar functions and effects to those of the above-described second embodiment can be exerted.

Moreover, in accordance with this embodiment, the second fixing plate 3C is composed of the silicon substrate as the conductor. Therefore, in the event of being joined to the silicon substrate 4A, the second fixing plate 3C is electrically connected to the silicon substrate 4A, and the upper surface (inner surface) 3aC of the second fixing plate can be electrically connected to the weight portions (movable bodies) 5 and 6, and can be set at the same potential as that of the weight portions (movable bodies) 5 and 6 concerned. Hence, it becomes unnecessary to form the antiadhesive film (metal film) on the upper surface (inner surface) 3aC of the second fixing plate 3C, and a manufacturing process of the acceleration sensor 1 can be simplified.

(Fifth Embodiment)

An acceleration sensor 1D according to this embodiment basically has similar configurations to those of the acceleration sensor 1A of the above-described second embodiment.

That is to say, in the acceleration sensor 1D, the first insulating substrate (first fixing plate) 2 is joined to the front surface (one-side surface: one surface) 4a of the silicon substrate 4A, and the second insulating substrate (second fixing plate) 3 is joined to the back surface (other-side surface: other surface) 4b of the silicon substrate 4A, whereby the space portion S is formed.

Moreover, the weight portions (movable bodies) 5 and 6 are formed without using the insulator.

Then, the static electricity suppressing means 70 for suppressing the static electricity from being generated in the space portion S is provided.

Also in this embodiment, the metal films (including the antiadhesive films 31 and 32 and the wires 26a) 26 are used as the static electricity suppressing means 70.

Here, the acceleration sensor 1D according to this embodiment is different from the acceleration sensor 1A of the above-described second embodiment mainly in that the antiadhesive films 31 and 32 (metal films) are formed on a recessed portion 3b formed on the upper surface (inner surface) 3a of the second insulating substrate (second fixing plate) 3.

Figure 15:
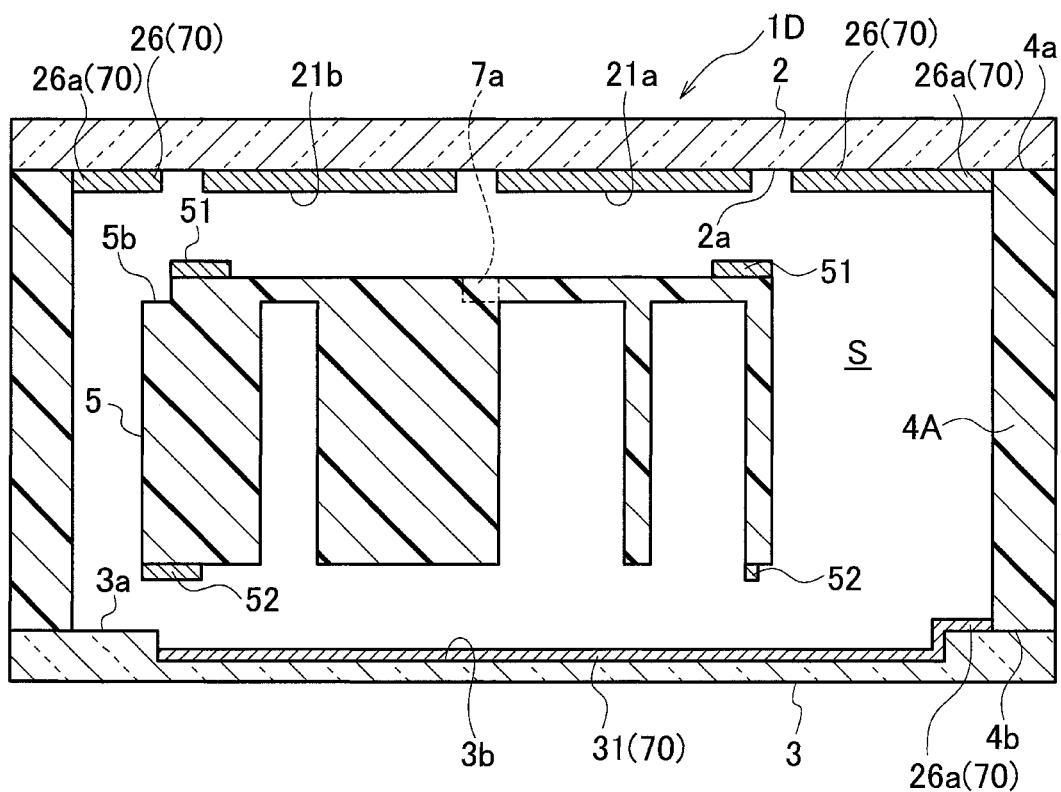
FIG. 15 is a cross-sectional view schematically showing an electrostatic capacitance sensor according to a fifth embodiment of the present invention.

In this embodiment, as shown in FIG. 15, the recessed portion 3b is formed on the upper surface (inner surface) 3a of the second insulating substrate (second fixing plate) 3, and the antiadhesive films (metal films) 31 and 32 are formed on the recessed portion 3b concerned. Note that it is preferable to set a depth of the recessed portion 3b at 3 µm or more.

As described above, the antiadhesive films (metal films) 31 and 32 are formed on the recessed portion 3b, whereby a distance between the weight portions (movable bodies) 5 and 6 and the second insulating substrate (second fixing plate) 3 is increased.

Also in accordance with this embodiment described above, similar functions and effects to those of the above-described second embodiment can be exerted.

Moreover, in accordance with this embodiment, the antiadhesive films (metal films) 31 and 32 are formed on the recessed portion 3b formed on the upper surface (inner surface) 3a of the second insulating substrate (second fixing plate) 3. Therefore, the distance between the weight portions (movable bodies) 5 and 6 and the second insulating substrate (second fixing plate) 3 can be increased. As described above, the distance from the second insulating substrate 3 to the weight portions (movable bodies) 5 and 6 is increased, whereby it is made possible to further reduce the influence of the static electricity, which is given to the weight portions (movable bodies) 5 and 6. As a result, it is made possible to suppress the unexpected variations of the attitudes of the weight portions (movable bodies) 5 and 6, and the detection accuracy of the electrostatic capacitance sensor 1D can be suppressed from being lowered.

(Sixth Embodiment)

An acceleration sensor 1E according to this embodiment basically has similar configurations to those of the acceleration sensor 1C of the above-described fourth embodiment.

That is to say, in the acceleration sensor 1E, the first insulating substrate (first fixing plate) 2 is joined to the front surface (one-side surface: one surface) 4a of the silicon substrate 4A, and the second fixing plate 3C is joined to the back surface (other-side surface: other surface) 4b of the silicon substrate 4A, whereby the space portion S is formed.

Moreover, the weight portions (movable bodies) 5 and 6 are formed without using the insulator.

Then, the static electricity suppressing means 70 for suppressing the static electricity from being generated in the space portion S is provided.

Also in this embodiment, the silicon substrate 3C and the metal films (including the wires 26a) 26 formed on the spots of the lower surface (inner surface) 2a of the first insulating substrate 2, which are other than the spots on which the fixed electrodes 21a and 21b and the fixed electrodes 22a and 22b are formed, are used as the static electricity suppressing means 70.

Here, the acceleration sensor 1E according to this embodiment is different from the acceleration sensor 1C of the above-described fourth embodiment mainly in that a recessed portion 3bC is formed on the upper surface (inner surface) 3aC of the second fixing plate 3C formed of the conductor.

Figure 16:
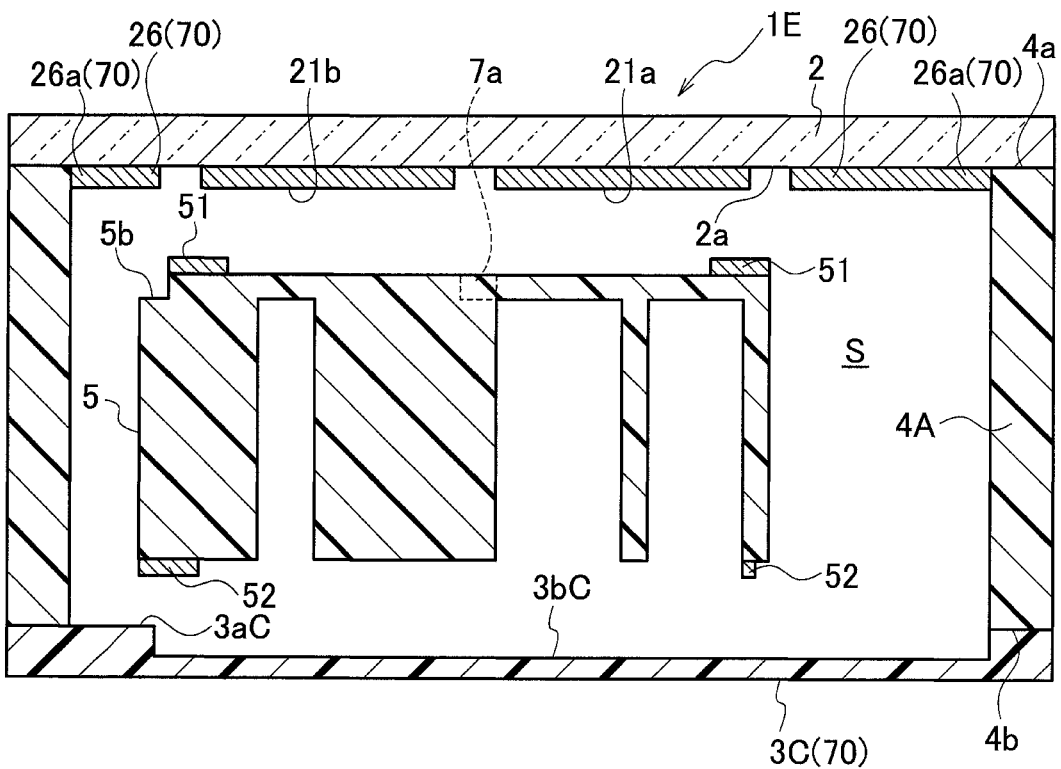
FIG. 16 is a cross-sectional view schematically showing an electrostatic capacitance sensor according to a sixth embodiment of the present invention.
Figure 17:
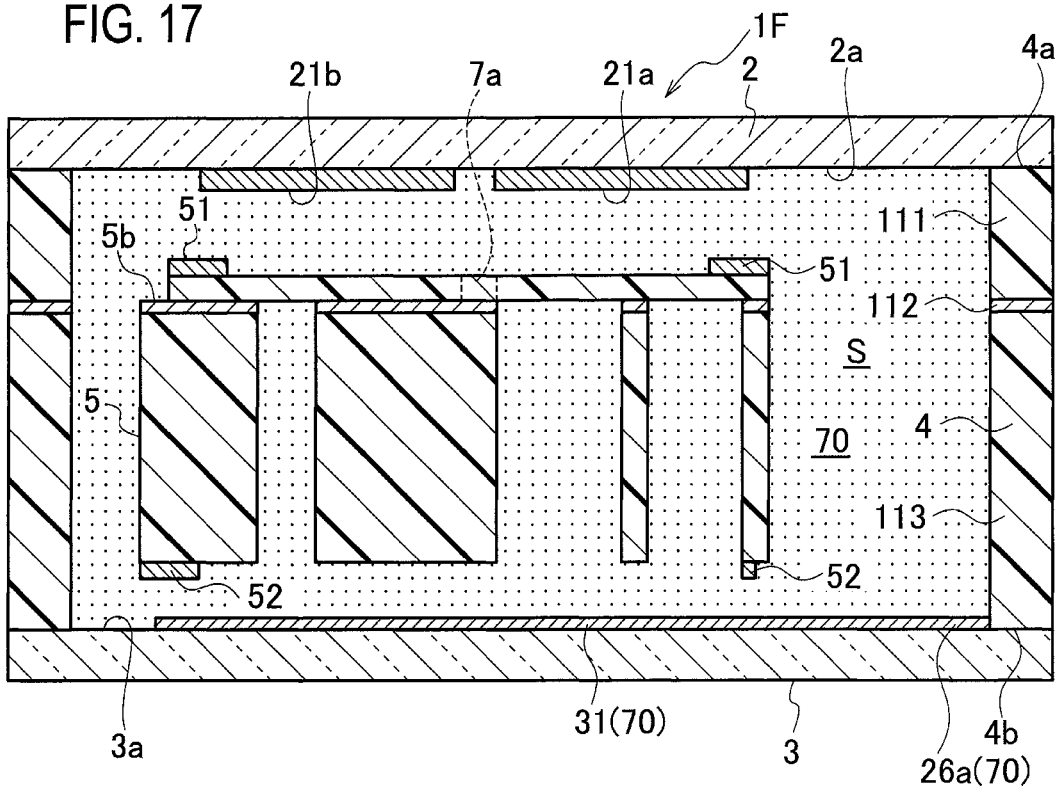
FIG. 17 is a cross-sectional view schematically showing an electrostatic capacitance sensor according to a seventh embodiment of the present invention.

In this embodiment, as shown in FIG. 16, the recessed portion 3bC is formed over the whole area of a spot of the upper surface (inner surface) 3aC of the second fixing plate 3C, the spot being opposite to the back surfaces of the weight portions (movable bodies) 5 and 6. Moreover, it is preferable to set a depth of the recessed portion 3bC at 3 µm or more.

Also in accordance with this embodiment described above, similar functions and effects to those of the above-described fourth embodiment can be exerted.

Moreover, in accordance with this embodiment, the recessed portion 3bC is formed on the upper surface (inner surface) 3aC of the second fixing plate 3C formed of the conductor. Therefore, the distance between the weight portions (movable bodies) 5 and 6 and the second fixing plate 3C can be increased. As described above, the distance from the second fixing plate 3C to the weight portions (movable bodies) 5 and 6 is increased, whereby it is made possible to further reduce the influence of the static electricity, which is given to the weight portions (movable bodies) 5 and 6. As a result, it is made possible to suppress the unexpected variations of the attitudes of the weight portions (movable bodies) 5 and 6, and the detection accuracy of the electrostatic capacitance sensor 1E can be suppressed from being lowered.

(Seventh Embodiment)

An acceleration sensor 1F according to this embodiment basically has similar configurations to those of the acceleration sensor 1 of the above-described first embodiment.

That is to say, in the acceleration sensor 1F, the first insulating substrate (first fixing plate) 2 is joined to the front surface (one-side surface: one surface) 4a of the silicon substrate 4, and the second insulating substrate (second fixing plate) 3 is joined to the back surface (other-side surface: other surface) 4b of the silicon substrate 4, whereby the space portion S is formed.

Then, the static electricity suppressing means 70 for suppressing the static electricity from being generated in the space portion S is provided.

Here, the acceleration sensor 1F according to this embodiment is different from the acceleration sensor 1 of the above-described first embodiment mainly in that a static electricity suppressing material, which is to be filled in the space portion S, is used as the static electricity suppressing means 70.

In this embodiment, air ionized by using an ionizer known in public or inert gas such as nitrogen and argon is used as the static electricity suppressing material, and the space portion S is filled with the ionized air or the like.

As described above, the space portion S is filled with the ionized air or the like, whereby it is made possible to further reduce the influence of the static electricity, which is given to the weight portions (movable bodies) 5 and 6. As a result, it is made possible to suppress the unexpected variations of the attitudes of the weight portions (movable bodies) 5 and 6, and the detection accuracy of the electrostatic capacitance sensor 1F can be suppressed from being lowered.

Hence, in accordance with this embodiment, even if the metal films 26 are not formed on the spots of the lower surface (inner surface) 2a of the first insulating substrate (first fixing plate) 2, which are other than the spots on which the fixed electrodes 21a and 21b and the fixed electrodes 22a and 22b are formed, it is made possible to further reduce the influence of the static electricity, which is given to the weight portions (movable bodies) 5 and 6. Moreover, it becomes unnecessary that the antiadhesive films 31 and 32 be provided with the function to suppress the generation of the static electricity, also leading to an advantage that it becomes easy to manufacture the acceleration sensor 1F.

(Eighth Embodiment)

An acceleration sensor 1G according to this embodiment basically has similar configurations to those of the acceleration sensor 1F of the above-described seventh embodiment.

That is to say, in the acceleration sensor 1G, the first insulating substrate (first fixing plate) 2 is joined to the front surface (one-side surface: one surface) 4a of the silicon substrate 4, and the second insulating substrate (second fixing plate) 3 is joined to the back surface (other-side surface: other surface) 4b of the silicon substrate 4, whereby the space portion S is formed.

Then, the static electricity suppressing means 70 for suppressing the static electricity from being generated in the space portion S is provided.

Also in this embodiment, the static electricity suppressing material to be filled in the space portion S is used as the static electricity suppressing means 70. That is to say, the space portion S is filled with the ionized air or the like, whereby the influence of the static electricity, which is given to the weight portions (movable bodies) 5 and 6, is further reduced.

Here, the acceleration sensor 1G according to this embodiment is different from the acceleration sensor 1F of the above-described seventh embodiment mainly in that a communication path 4c, which allows the space portion S to communicate with the atmosphere (outer space), is formed in the electrostatic capacitance sensor 1G.

Figure 18:
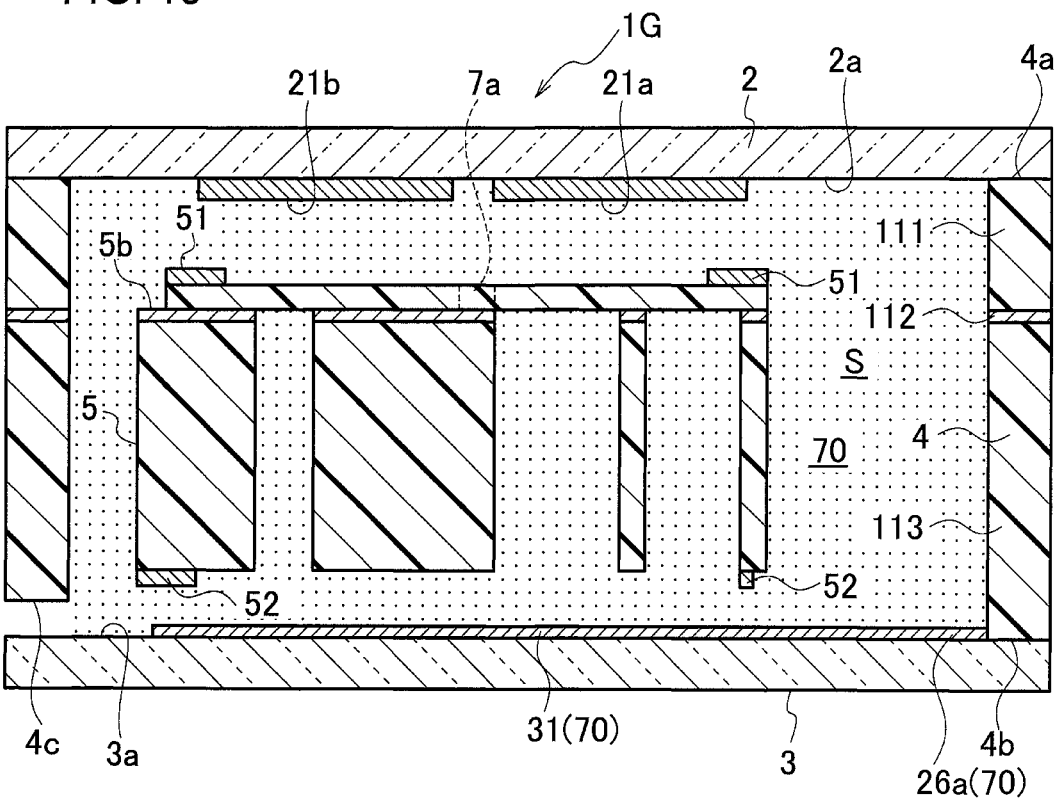
FIG. 18 is a cross-sectional view schematically showing an electrostatic capacitance sensor according to an eighth embodiment of the present invention.

In this embodiment, as shown in FIG. 18, the communication path 4c is formed in a lower portion of the silicon substrate 4, and allows the space portion S to communicate with the atmosphere (outer space).

Also in this embodiment, similar functions and effects to those of the above-described seventh embodiment can be exerted.

Moreover, in accordance with this embodiment, the communication path 4c, which allows the space portion S to communicate with the atmosphere (outer space), is formed in the electrostatic capacitance sensor 1G. As described above, the space portion S is allowed to communicate with the atmosphere (outer space), whereby humidness in the space portion S is prompted, and humidity in the space portion S can be enhanced. As a result, the static electricity in the space portion S can be released to the outside, and it is made possible to further reduce the influence of the static electricity, which is given to the weight portions (movable bodies) 5 and 6. As a result, it is made possible to suppress the unexpected variations of the attitudes of the weight portions (movable bodies) 5 and 6, and the detection accuracy of the electrostatic capacitance sensor 1G can be suppressed from being lowered.

The description has been made above of the preferred embodiments of the present invention; however, the present invention is not limited to the above-described embodiments, and is modifiable in various ways.

For example, in each of the above-described embodiments, the acceleration sensor that detects the accelerations in two directions, which are the X-direction and the Z-direction, is illustrated; however, there may be employed such an acceleration sensor that detects accelerations in three directions, which are the Y-direction as well as the X-direction and the Z-direction, in such a manner that one of the weight portions is arranged so as to be rotated by 90 degrees in the XY plane.

Moreover, in each of the above-described embodiments, the acceleration sensor is illustrated as the electrostatic capacitance sensor; however, without being limited to this, the present invention can also be applied to other electrostatic capacitance sensors.

Moreover, it is also possible to adopt embodiments, in which the configurations described in the foregoing first to eighth embodiments are arbitrarily combined with one another.

Furthermore, it is also possible to appropriately change specifications (shapes, sizes, layout and the like) of the weight portions, the fixed electrodes, and other details.

What is claimed is:
1. An electrostatic capacitance sensor, including:
a substrate having a movable body;
a first fixing plate;
a second fixing plate;
a fixed electrode disposed on the first fixing plate and arranged opposite to the movable body at an interval,
wherein the first fixing plate is joined to one surface of the substrate, and the second fixing plate is joined to the other surface of the substrate,
wherein a metal film is disposed on a portion of an inner surface of the first fixing plate, the portion being other than a portion on which the fixed electrode is disposed, the metal film being electrically insulated from the fixed electrode,
wherein the movable body has a protruding portion facing the first fixing plate, and
wherein the metal film is not located above the movable body when viewed in plan.

2. The electrostatic capacitance sensor according to claim 1, wherein the movable body is formed without using an insulator.

3. The electrostatic capacitance sensor according to claim 1, wherein the metal film is formed on a recessed portion of the inner surface of the first fixing plate.

4. The electrostatic capacitance sensor according to claim 1, wherein a communication path that allows the space portion to communicate with an outer space is formed in the substrate.

5. The electrostatic capacitance sensor according to claim 1, wherein the second fixing plate is a conductor.

6. The electrostatic capacitance sensor according to claim 5, wherein a recessed portion is formed on an inner surface of the second fixing plate.

7. The electrostatic capacitance sensor according to claim 1, wherein a static electricity suppressing material is filled in a space portion formed between the first fixing plate and the second fixing plate.

8. The electrostatic capacitance sensor according to claim 7, wherein the static electricity suppressing material is either of ionized air and inert gas.

9. An electrostatic capacitance sensor, including:
a substrate having a movable body;
a first fixing plate;
a second fixing plate;
a fixed electrode disposed on the first fixing plate and arranged opposite to the movable body at an interval;
wherein the first fixing plate is joined to one surface of the substrate, and the second fixing plate is joined to the other surface of the substrate,
wherein a metal film is disposed on a portion of an inner surface of the first fixing plate, the portion being other than a portion on which the fixed electrode is disposed, the metal film being electrically insulated from the fixed electrode,
wherein the movable body has a recess portion facing the first fixing plate, and
wherein the metal film is not located above the recess portion when viewed in plan.

* * * * *